US010366999B2

(12) United States Patent
Maillard

(10) Patent No.: US 10,366,999 B2
(45) Date of Patent: Jul. 30, 2019

(54) SINGLE EVENT UPSET (SEU) MITIGATION FOR FINFET TECHNOLOGY USING FIN TOPOLOGY

(71) Applicant: Xilinx, Inc., San Jose, CA (US)

(72) Inventor: Pierre Maillard, San Jose, CA (US)

(73) Assignee: XILINX, INC., San Jose, CA (US)

( * ) Notice: Subject to any disclaimer, the term of this patent is extended or adjusted under 35 U.S.C. 154(b) by 323 days.

(21) Appl. No.: 15/087,947

(22) Filed: Mar. 31, 2016

(65) Prior Publication Data

US 2017/0287919 A1 Oct. 5, 2017

(51) Int. Cl.
| H01L 27/11 | (2006.01) |
| H01L 29/08 | (2006.01) |
| H01L 29/78 | (2006.01) |
| H01L 27/088 | (2006.01) |
| H01L 27/092 | (2006.01) |

(52) U.S. Cl.
CPC ...... *H01L 27/1116* (2013.01); *H01L 27/0886* (2013.01); *H01L 27/0924* (2013.01); *H01L 27/1104* (2013.01); *H01L 29/0847* (2013.01); *H01L 29/7851* (2013.01)

(58) Field of Classification Search
CPC .......................... H01L 27/1116; H01L 27/0886
See application file for complete search history.

(56) References Cited

U.S. PATENT DOCUMENTS

| 2006/0214233 A1 | 9/2006 | Ananthanarayanan et al. |
| 2007/0134878 A1* | 6/2007 | Brask ................ H01L 29/66795 438/294 |
| 2009/0209074 A1* | 8/2009 | Anderson ......... H01L 29/66795 438/283 |
| 2015/0121329 A1* | 4/2015 | Fu ........................ G06F 17/5068 716/133 |
| 2017/0033012 A1* | 2/2017 | Walke ............. H01L 21/823431 |

OTHER PUBLICATIONS

Ananthan, Hari et al., "FinFET SRAM—Device and Circuit Design Considerations," Proc. of the 2004 IEEE 5th International Symposium on Quality Design, Mar. 22, 2004, pp. 511-516, IEEE, Piscataway, New Jersey, USA.
Hayashida, Tetsuro et al., "Fin-Height Effect on Poly-Si/PVD-TiN Stacked-Gate FinFET Performance," IEEE Transactions on Electron Devices, Mar. 2012, pp. 647-653, vol. 59, No. 3, IEEE, Piscataway, New Jersey, USA.

(Continued)

*Primary Examiner* — Marc Anthony Armand
(74) *Attorney, Agent, or Firm* — Keith Taboada

(57) ABSTRACT

Front end circuits that include a FinFET transistor are described herein. In one example, the front end circuit has a FinFET transistor that includes a channel region wrapped by a metal gate, the channel region connecting a source and drain fins. At least one of the source and drain fins have a height ($H_{TOT}$) and a width W. The height ($H_{TOT}$) is greater than an optimal height ($H_{OPT}$), wherein the height $H_{OPT}$ is a height that would optimize speed of a FinFET transistor having the width W.

17 Claims, 2 Drawing Sheets

(56) References Cited

OTHER PUBLICATIONS

Tam, N. et al., "Multi-Cell Soft Errors at the 16-nm FinFET Technology Node," Proc. of the 2015 IEEE International Reliability Physics Symposium, Apr. 19, 2015, pp. 4B.3.1-4B.3.5, IEEE, Piscataway, New Jersey, USA.

Villacorta, Hector et al., "FinFET SRAM Hardening Through Design and Technology Parameters Considering Process Variations," Proc. of the 2013 IEEE 14th European Conference on Radiation and its Effects on Components and Systems, Sep. 23, 2013, pp. 1-7, IEEE, Piscataway, New Jersey, USA.

Dodd, Paul E. et al., "Basic Mechanisms and Modeling of Single-Event Upset in Digital Microelectronics," IEEE Transactions on Nuclear Science, Jun. 2003, pp. 583-602, Vo. 50, No. 3, IEEE, Piscataway, New Jersey, USA.

\* cited by examiner

SINGLE EVENT UPSET (SEU) MITIGATION FOR FINFET TECHNOLOGY USING FIN TOPOLOGY

TECHNICAL FIELD

Embodiments of the present invention generally relate to a FinFET transistor disposed in a front end circuit, and more particularly, to a front end circuit that include FinFET transistors disposed in front end circuit structures, such a static random access memory (SRAM) structure, among others.

BACKGROUND

FinFET transistors have begun to replace traditional planar transistors in next generation devices due to the ability to enhance the control of current flowing between source and drain regions of the transistors at smaller nanometer nodes. Devices, such as memory structures, also benefit from the use of FinFET transistors because FinFET transistors have lower power and provide increased transistor density while enabling improved device performance.

Memory structures that use FinFET transistors remain susceptible to single event upsets (SEU), just like planar transistors. SEU may be caused by any number of factors. The failure rate associated with SEU events is commonly known as Soft Error Rate (SER), and the industrial metric used to quantify the SER of the circuit is known as FIT rate or FIT/Mb Soft Error Rate (SER). The complimentary random access memory (CRAM) FIT rate is characterized using JESD89A standards. However, the SER often undesirably increases as the size of memory structures continue to shrink.

FinFET transistors may be used in both front end circuits and back end circuits. However, the performance of the FinFET transistors is often dependent on whether the FinFET transistor is part of a front end or back end circuit. Thus, solutions for improving SER often cannot universally be applied to both front and back end circuits. Improving SER in front end circuits is particularly difficult due to high parasitics, particularly at high frequencies.

Thus, there is a need for an improved FinFET transistor suitable for front end circuits.

SUMMARY

Front end circuits having at least one FinFET transistor, such as used in memory structures, are described herein. In one example, a front end circuit includes a FinFET transistor having a channel region wrapped by a metal gate, the channel region connecting a source and drain fins. At least one of the source and drain fins have a height ($H_{TOT}$) and a width W. The height ($H_{TOT}$) is greater than an optimal height ($H_{OPT}$), wherein the height $H_{OPT}$ is a height that would optimize speed of a FinFET transistor having the width W.

In another example, a front end circuit includes a memory structure, the memory structure including at least one FinFET transistor. The FinFET transistor of the memory structure includes a channel region wrapped by a metal gate, the channel region connecting a source and drain fins. At least one of the source and drain fins have a height ($H_{TOT}$) and a width W. The height ($H_{TOT}$) is greater than an optimal height ($H_{OPT}$), wherein the height $H_{OPT}$ is a height that would optimize speed of a FinFET transistor having the width W.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 1:
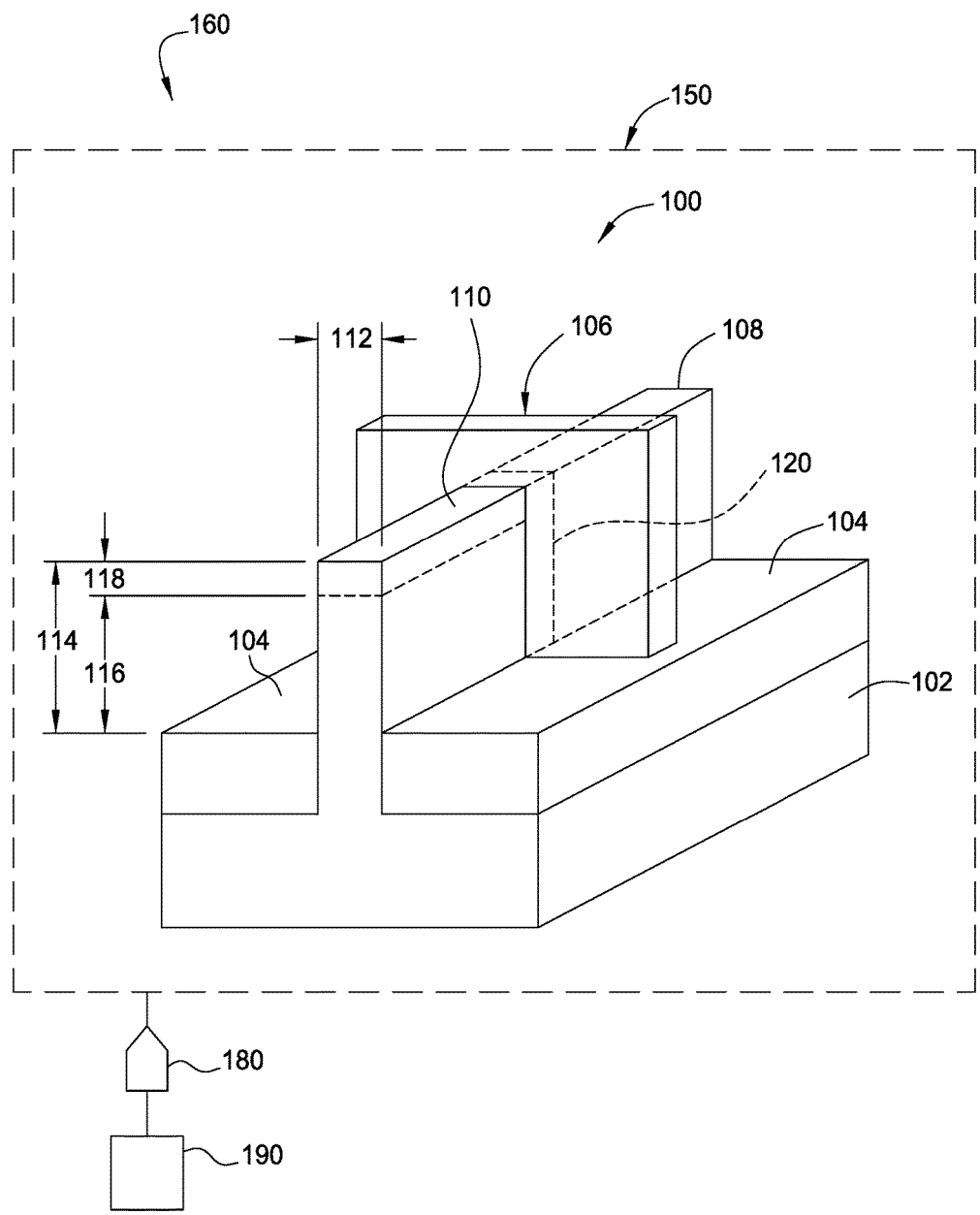
FIG. 1 is a circuit diagram of a front end circuit that includes a FinFET transistor, the FinFET transistor schematically illustrated in an isometric view.

As discussed above, front end circuits that use FinFET transistors remain susceptible to SEU. The inventor has observed that one cause of SEUs in FinFET transistors are high energy particle strikes. High energy particles include neutrons, thermal neutrons, alpha particles and the like. A high energy particle strike on a reverse biased n-channel metal-oxide-semiconductor (NMOS) field-effect transistor (usually the drain) of a static random access memory cell (SRAM) structure may lead to a bit flip or single event upset (SEU) as the strike ($I_{strike}$) current going through the struck transistor may be larger than the restoring transistor current ($I_{restore}$) attempting to recover the output voltage drop the particle induced current. The larger $I_{restore}$, relative to $I_{strike}$, the shorter recovery time for the memory structure. Same behavior was observed for a strike on a PMOS transistor.

The probability of an SEU occurrence can be significantly reduced by reducing the recovery time of the struck node voltage as the single-event current fades away or by slowing down the time needed for the voltage transient to feedback through the cross-coupled inverters and "store" the wrong state in the SRAM structure. One method to decrease the SRAM structure recovery time is to use larger and/or oversized restoring P or NMOS devices, thereby increasing the device's restoring current. This technique is effective but significantly increases the die area of the memory structure, and by extension the cost of the device in which the memory structure is comprised.

FinFET transistors have been proven to significantly reduce the FIT due to its significantly smaller sensitive volume relative to transistors fabricated using planar technology. Also, since the charge conduction path between the source and drain of the transistor is mainly confined in narrow channel relative to planar technology, much of the ion strike charges dissipate in the substrate before they can be collected in the sensitive volume, thus, reducing the probability of an SEU (single bit upsets or multiple bit upsets) occurrence.

Advantageously, the FinFET transistors described herein enhance the reduction of the SRAM recovery time with a negligible impact on the die area, while reducing the SRAM FIT rate. For example, the SEU of a FinFET transistor may be decreased by increasing the fin height of the source and drain of the FinFET transistor structure beyond the fin height that would yield optimal device performance (i.e., speed of the memory structure). The increased fin height correspondingly causes an increase in the restoring current of the FinFET transistor, thus increasing the overall restoring current of the memory structure and therefore decreasing the SEU error rate. Such memory devices utilizing FinFET transistors having increased fin height have demonstrated about an 8 percent increase in drain current per nm of fin height increase and about a 5 percent increase in drain current per nm fin height increase. In one example, increasing the fin height of the FinFET transistor by 3 nm reduced the probability of SEU by about 20 percent. The increase fin height of the FinFET transistor allows most of the charge from impacting particles to be dissipated in the fin before diffusing and being collected by adjacent SRAMS structures, thus adding an extra protection again multi-bit upsets and minimizing the occurrence of uncorrectable events in electronic devices in which the FinFET transistor or memory structure containing the same are utilized.

FIG. 1 is a schematic diagram of one example of an electronic circuit 160 having a front end circuit 150 coupled to a back end circuit 190 through an analog to digital converter (ADC) 180. The front end circuit 150 includes a FinFET transistor 100, illustratively shown in an isometric view. The front end circuit 150 may be a receiver, filter, amplifier and the like, and may optionally include memory, as further discussed below.

The FinFET transistor 100 may be formed by additive or subtractive techniques, including techniques currently known or developed in the future. The FinFET transistor 100 is formed on a substrate 102. The substrate 102 may be a silicon wafer or other suitable substrate. The FinFET transistor 100 is includes a metal gate 106 which extends upwards from the substrate 102. The metal gate 106 generally has a fin shape that is perpendicular to a plane of the substrate 102.

Shallow trench isolation (STI) regions 104 are formed on or in the substrate 102 on either side of the metal gate 106. In one example, the (STI) regions 104 may be formed from silicon oxide, silicon nitride, silicon oxynitride, fluoride-doped silicate glass (FSG), low-k dielectric, or other suitable material.

The metal gate 106 separates a source fin 110 from a drain fin 108. The source and drain fins 110, 108, which also extend upwards from the substrate 102, are generally aligned in a common plane extending perpendicular to a plane of the substrate 102. The source and drain fins 110, 108 also are oriented perpendicular to a plane of the metal gate 106. The source and drain fins 110, 108 may be formed by additive or subtractive techniques. In one example, the source and drain fins 110, 108 may be formed may be formed from silicon, silicon germanium, germanium or III-V material. The source and drain fins 110, 108 may be covered with thin oxide layer.

The metal gate 106 wraps around a channel region 120 defined between the source and drain fins 110, 108. The channel region 120 is formed from the same material as the fins 110, 108. When the metal gate 106 is energized, current flows through the channel region 120 from the source fin 110 to the drain fin 108.

The metal gate 106 is formed from a gate electrode disposed over a gate dielectric material. The gate dielectric material separates the gate electrode from the channel region 120. The gate electrode may be polysilicon, Ta, TiN, TiAlN, TiSiN, TaN, TaAlN, TaSiN, W, WN, Re, Ir, Ru, Mo, Al, Cu, CO, Ni, WN/RuO$_2$, ZrSi2, MoSi2, TaSi2, NiSi2, or other suitable material.

The gate dielectric material may be a high-K oxide, such as a hafnium based material. Examples of hafnium based materials that are suitable for use as the gate dielectric material include HfO$_x$, HfSiO$_x$, HfSiON, HfZrO, HfLaO, HfTaO, HfTiO and the like. Alternatively, the gate dielectric material may LaO, AlO, ZrO, ZrO2, ZrSiO2, LaSiO, AlSiO, TiO, Ta$_2$O$_5$, Ta$_2$O$_3$, Y$_2$O$_3$, STO, BTO, BaZrO, or other suitable material. In one example, the metal gate 106 is formed from a polysilicon gate electrode disposed over an HfO$_x$ gate dielectric material.

The metal gate 106 may also include additional layers, such as capping layers and interfacial layers. For example, a capping layer may be disposed between the gate dielectric material and the metal gate material. The capping layer may be lanthanum oxide, LaSiO, manganese oxide, aluminum oxide, or other suitable material. The capping layer may have a thickness ranging from about 3 to about 10 angstroms. In another example, an interfacial layer may be disposed between the gate dielectric material and the channel region 120. The interfacial layer may have a thickness ranging from about 3 to about 10 angstroms. The interfacial layer may be an oxide, such as silicon oxide or silicon oxynitride. Alternatively, the interfacial layer may be silicon nitride or other suitable material.

The source and drain fins 110, 108 generally includes a width 112 and a total height ($H_{TOT}$) 114. The total height 114 is the distance that the fins 110, 108 extend above the STI regions 104. The total height 114 may be described as the summation of an optimal height ($H_{OPT}$) 116 and an additional height ($H_{ADD}$) 118.

In conventional FinFET transistors, the aspect ratio (height/width) of source and drain fins is typically selected to optimize transistor performance in light of density and size requirements. Thus, for a given width, the height of the source and drain fins is selected to maximize transistor performance. Transistor performance is generally defined herein as the operational speed of the transistor. If the height of the source and drain fins exceeds the optimal fin height for a given width, transistor performance (i.e., speed) will be disadvantageously reduced. Particularly, it is well known that excess fin height will undesirably increase parasitics and R/C delay.

However, the inventors have discovered that by increasing the fin height beyond the optimal fin height for a given width, the FinFET transistor is significantly more resistant to SEU events due to high energy particle strikes. The SEU resistant FinFET transistor is highly desirable for applications requiring hardened devices, such as military and aerospace applications. Thus, in certain applications, SEU resistance is more important that FIT rate. The FinFET transistor 100 described herein has a greater SEU resistance as compared to conventional transistors.

The FinFET transistor 100 is hardened, i.e., made more SEU resistant, by increasing the total height 114 of the fins 110, 108 by the additional height 118 above that of the optimal height 116 that would provide optimal transistor performance for the width 112. Thus, the FinFET transistor 100 will have a lower transistor performance as compared to a conventional FinFET transistor having a fin height equal to the optimal height 116 selected for a width equal to the width 112.

In one example, the additional height 118 is at least 1 nm, for example at least 3 nm. In another example, the additional height 118 is between about 2 nm and about 10 nm. As discussed above, the FinFET transistor 100 having an additional fin height 118 of 3 nm exhibits a reduced probability of SEU by about 20 percent as compared to a conventional FinFET transistor. Thus, the reliability of the FinFET transistor 100, and structures (such as memory) and devices made therefrom, are significantly increased by reducing the probability of SEU events.

Figure 2:
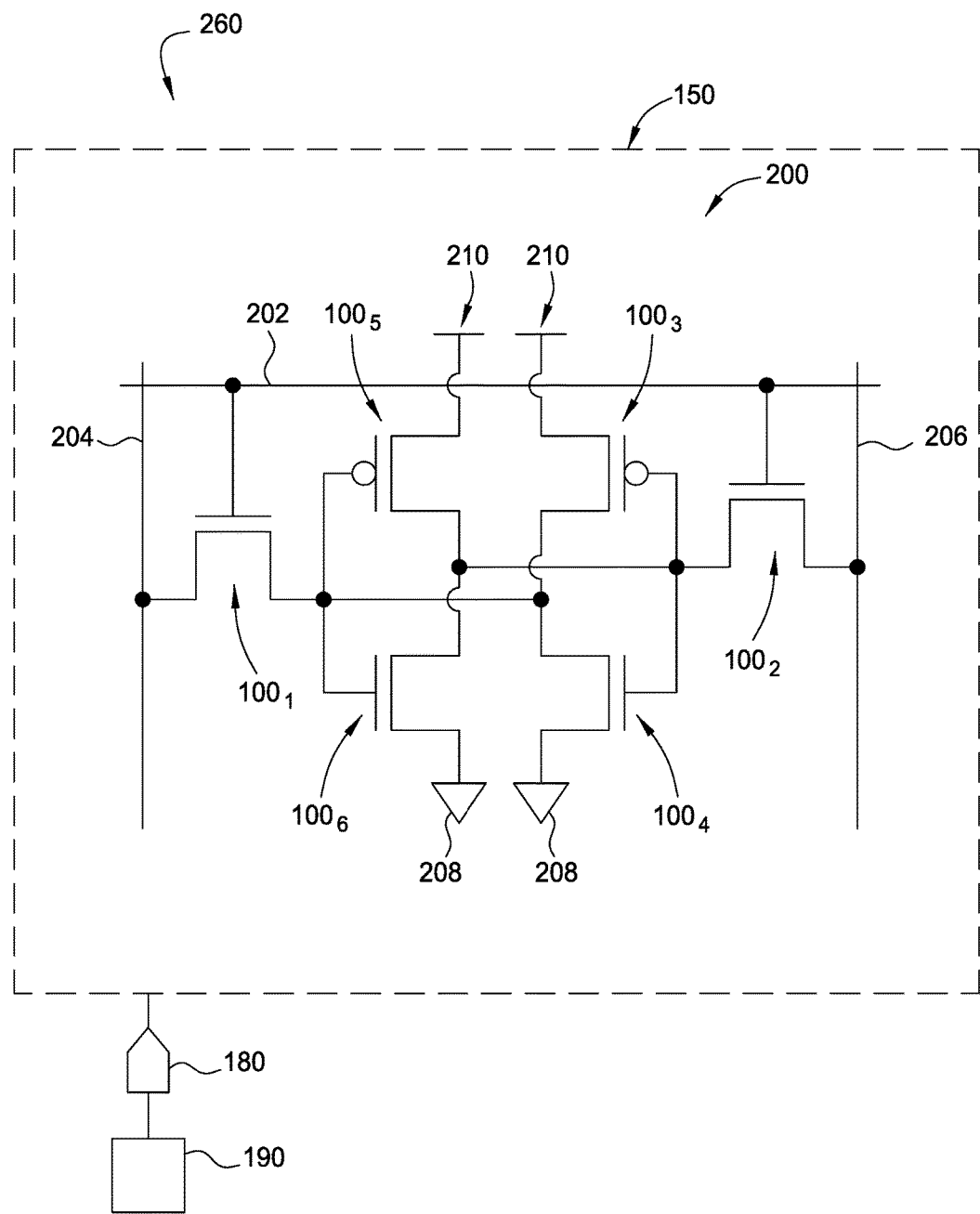
FIG. 2 is a circuit diagram of an exemplary front end circuit that includes memory structure having FinFET transistors.

FIG. 2 is a schematic circuit diagram of an electronic circuit 260 having a front end circuit 150 coupled to a back end circuit 190 through an analog to digital converter (ADC) 180. As discussed above, the front end circuit 150 may be a receiver, filter, amplifier and the like, and may optionally include memory, as further discussed below.

The front end circuit 150 illustrated in FIG. 2 includes an exemplary memory structure 200 having FinFET transistors 100. Although the memory structure 200 depicted in FIG. 2 is configured as a SRAM structure, it is contemplated that other memory structures may incorporate one or more FinFET transistors 100 in their circuit structures in order to benefit from the reduced probability of SEU events and corresponding FIT rate reduction in the front end circuit 150 of the electronic circuit 260.

In the example depicted in FIG. 2, the circuit of the memory structure 200 includes six FinFET transistors, illustrated in FIG. 2 as FinFET transistor $100_1$, FinFET transistor $100_2$, FinFET transistor $100_3$, FinFET transistor $100_4$, FinFET transistor $100_5$, and FinFET transistor $100_6$. The metal gates (such as the metal gates 106 illustrated in FIG. 1) of FinFET transistor $100_1$ and FinFET transistor $100_2$ are coupled to a word line 202. The source (such as the source fin 110) of the FinFET transistor $100_1$ is coupled to Bit line 204. The source of the FinFET transistor $100_2$ is coupled to NBit line 206.

The drain (such as the drain fin 108) of the FinFET transistor $100_1$ is coupled to an inverted metal gate of FinFET transistor $100_5$ and to the metal gate of FinFET transistor $100_6$. The drain of the FinFET transistor $100_1$ is coupled to a source of FinFET transistor $100_3$ and to a source of FinFET transistor $100_4$.

The drain (such as the drain fin 108) of the FinFET transistor $100_2$ is coupled to an inverted metal gate of FinFET transistor $100_3$ and to the metal gate of FinFET transistor $100_4$. The drain of the FinFET transistor $100_2$ is coupled to a source of FinFET transistor $100_5$ and to a source of FinFET transistor $100_6$.

The drains of FinFET transistors $100_5$ and $100_3$ are coupled to voltage sources 210. The drains of FinFET transistors $100_6$ and $100_4$ are coupled to ground 208.

As the FinFET transistors 100 have a reduced probability of SEU events as compared to conventional transistors, the memory structure 200 is more robust compared to conventional memory devices. The increase fin height of the FinFET transistor 100 allows most of the charge from impacting particles to be dissipated in the fin before diffusing and being collected by the memory structure 200, thus adding an extra protection again multi-bit upsets and minimizing the occurrence of uncorrectable events in electronic devices in which memory structure 200 is utilized.

Thus, a front end circuit is provided that includes a FinFET transistor that reduces FIT rates associated with high energy particle strikes. The FinFET transistor has a greater fin height as compared to conventional structures, which in some examples, has demonstrated a reduction in the probability of an SEU event by about 20 percent.

While the foregoing is directed to embodiments of the present invention, other and further embodiments of the invention may be devised without departing from the basic scope thereof, and the scope thereof is determined by the claims that follow.

What is claimed is:

1. A front end circuit comprising:
   a FinFET transistor comprising:
      a metal gate;
      a source fin;
      a drain fin;
      a channel region wrapped by the metal gate, the channel region connecting the source and drain fins;
      wherein at least one of the source and drain fins have a height ($H_{TOT}$) and a width W, the height ($H_{TOT}$) is greater than an optimal height ($H_{OPT}$), wherein the height $H_{OPT}$ is a height that would optimize speed of a FinFET transistor having the width W.

2. The front end circuit of claim 1, wherein the height ($H_{TOT}$) is at least 3 nm greater than the height ($H_{OPT}$).

3. The front end circuit of claim 1, wherein the height ($H_{TOT}$) is between about 2 nm and about 10 nm greater than the height ($H_{OPT}$).

4. The front end circuit of claim 1, wherein the front end circuit includes at least one of a receiver, an amplifier, a filter, or a memory structure.

5. A front end circuit comprising:
   a memory structure comprising:
      at least one FinFET transistor comprising:
         a metal gate;
         a source fin;
         a drain fin;
         a channel region wrapped by the metal gate, the channel region connecting the source and drain fins;
         wherein at least one of the source and drain fins have a height ($H_{TOT}$) and a width W, the height ($H_{TOT}$) is greater than an optimal height ($H_{OPT}$), wherein the height $H_{OPT}$ is a height that would optimize speed of a FinFET transistor having the width W.

6. The front end circuit of claim 5, wherein the height ($H_{TOT}$) is at least 3 nm greater than the height ($H_{OPT}$).

7. The front end circuit of claim 5, wherein the height ($H_{TOT}$) is between about 2 nm and about 10 nm greater than the height ($H_{OPT}$).

8. The front end circuit of claim 5, wherein the at least one FinFET transistor comprises a plurality of FinFET transistors.

9. The front end circuit of claim 5, wherein the memory structure comprises an SRAM memory structure.

10. The front end circuit of claim 5, wherein the front end circuit includes at least one of a receiver, an amplifier, or a filter.

11. An electronic circuit comprising:
    a front end circuit comprising:
       a SRAM memory structure comprising a plurality of FinFET transistors, wherein at least a first FinFET transistor of the plurality of FinFET transistors comprises:
          a metal gate;
          a source fin;
          a drain fin;
          a channel region wrapped by the metal gate, the channel region connecting the source and drain fins;
          wherein at least one of the source and drain fins have a height ($H_{TOT}$) and a width W, the height ($H_{TOT}$) is greater than an optimal height ($H_{OPT}$), wherein the height $H_{OPT}$ is a height that would optimize speed of a FinFET transistor having the width W.

12. The electrical circuit of claim 11, wherein the height ($H_{TOT}$) is at least 3 nm greater than the height ($H_{OPT}$).

13. The electrical circuit of claim 11, wherein the height ($H_{TOT}$) is between about 2 nm and about 10 nm greater than the height ($H_{OPT}$).

14. The electrical circuit of claim 11, wherein the front end circuit includes at least one of a receiver, an amplifier, or a filter.

15. The electrical circuit of claim 11, wherein a second FinFET transistor of the plurality of FinFET transistors comprising the SRAM memory structure comprises:
   a metal gate;
   a source fin;
   a drain fin;
   a channel region wrapped by the metal gate, the channel region connecting the source and drain fins;
   wherein at least one of the source and drain fins have a height ($H_{TOT}$) and a width W, the height ($H_{TOT}$) is greater than an optimal height ($H_{OPT}$), wherein the height $H_{OPT}$ is a height that would optimize speed of a FinFET transistor having the width W.

16. The electrical circuit of claim 11 further comprising:
   a back end circuit coupled to the front end circuit through an analog to digital converter (ADC).

17. The electrical circuit of claim 16, wherein the front end circuit includes at least one of a receiver, an amplifier, or a filter.

* * * * *